US007595678B2

(12) United States Patent
Cao et al.

(10) Patent No.: US 7,595,678 B2
(45) Date of Patent: Sep. 29, 2009

(54) SWITCHED-CAPACITOR CIRCUIT

(75) Inventors: Zhiheng Cao, Dallas, TX (US); Shouli Yan, Austin, TX (US)

(73) Assignee: The Board of Regents, University of Texas System, Austin, TX (US)

( * ) Notice: Subject to any disclaimer, the term of this patent is extended or adjusted under 35 U.S.C. 154(b) by 0 days.

(21) Appl. No.: 11/853,509

(22) Filed: Sep. 11, 2007

(65) Prior Publication Data

US 2008/0061858 A1 Mar. 13, 2008

Related U.S. Application Data

(60) Provisional application No. 60/825,230, filed on Sep. 11, 2006.

(51) Int. Cl.
*G06F 7/64* (2006.01)

(52) U.S. Cl. ........................................ 327/337; 327/96

(58) Field of Classification Search .................. 327/96, 327/337, 509
See application file for complete search history.

(56) References Cited

U.S. PATENT DOCUMENTS 7,477,087 B2 * 1/2009 Kapusta, Jr. ................ 327/337
2008/0061857 A1 * 3/2008 Kapusta ...................... 327/337

* cited by examiner

*Primary Examiner*—Tuan Lam
*Assistant Examiner*—Hiep Nguyen
(74) *Attorney, Agent, or Firm*—Anthony P. Ng; Dillon & Yudell LLP

(57) ABSTRACT

A low-power switched-capacitor circuit is disclosed. The low-power switched-capacitor circuit includes a p-channel switched-capacitor integrator and an n-channel switched-capacitor integrator. The p-channel switched-capacitor integrator includes a first set of input transistors controlled by a first set of capacitors and switches. The n-channel switched-capacitor integrator includes a second set of input transistors controlled by a second set of capacitors and switches. The p-channel switched-capacitor integrator and the n-channel switched-capacitor integrator function together in a push-pull fashion such that a required transconductance as well as width and drain current of the first and second sets of input transistors are reduced by half of those in a conventional switch-capacitor circuit.

7 Claims, 3 Drawing Sheets

SWITCHED-CAPACITOR CIRCUIT

RELATED APPLICATION

The present application claims priority under 35 U.S.C. § 119(e)(1) to provisional application No. 60/825,230 filed on Sep. 11, 2006, the contents of which are incorporated herein by reference.

BACKGROUND OF THE INVENTION

1. Technical Field

The present invention relates to electronic circuits in general, and in particular to switched-capacitor circuits.

2. Description of Related Art

Switched-capacitor circuits are generally employed in a wide range of electronic devices such as analog-to-digital converters, digital-to-analog converters, delta-sigma modulators, filters, power supplies, voltage regulators, etc. In a basic switched-capacitor circuit, an input voltage is sampled onto a sampling capacitor during a first clock phase. During a non-overlapping second clock phase, the charges in the sampling capacitor are transferred to an integration capacitor. The output of the integration capacitor is subsequently fed back to a summing node. The impedance of the switched-capacitor circuit generally depends on the size of the sampling and integration capacitors and the frequency of a clock.

For many applications, special packaging or even heat sinks are commonly required to remove excessive heat dissipated from high-power integrated circuit devices. As a result, the amount of circuits and functions that can be integrated within one chip may be limited. Thus, many high-power applications can be benefited from comparable low-power circuits. As much as low-power circuits being important to non-portable electronic devices, low-power circuits are becoming increasingly in demand due to the proliferation of portable electronic devices such as mobile telephones, mp3 players, etc.

The present disclosure provides a low-power switched-capacitor circuit.

SUMMARY OF THE INVENTION

In accordance with a preferred embodiment of the present invention, a switched-capacitor circuit includes a p-channel switched-capacitor integrator and an n-channel switched-capacitor integrator. The p-channel switched-capacitor integrator includes a first set of input transistors controlled by a first set of capacitors and switches. The n-channel switched-capacitor integrator includes a second set of input transistors controlled by a second set of capacitors and switches. The p-channel switched-capacitor integrator and the n-channel switched-capacitor integrator function together in a push-pull fashion such that a required transconductance as well as width and drain current of the first and second sets of input transistors are reduced by half of those in a conventional switch-capacitor circuit.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
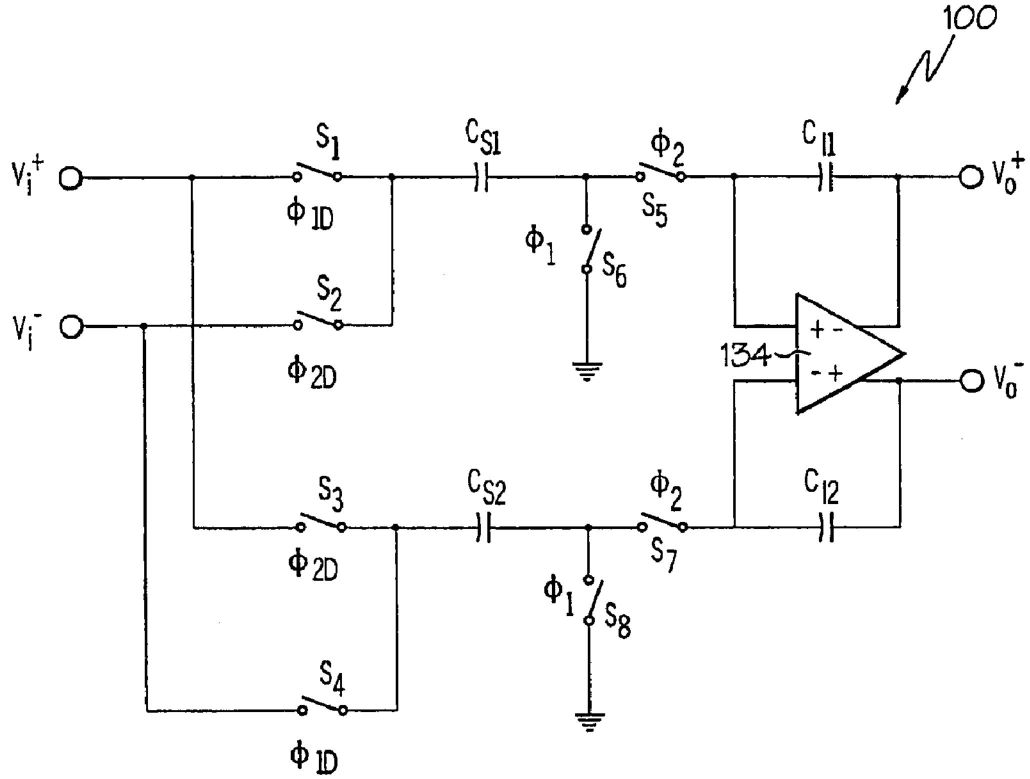
FIG. 1*a* is a schematic diagram of a switched-capacitor circuit, according to the prior art.

Referring now to the drawings and in particular to FIG. 1*a*, there is depicted a schematic diagram of a switched-capacitor circuit, according to the prior art. As shown, a switched-capacitor circuit 100 includes an operational amplifier 134, sampling capacitors $C_{S1}$, $C_{S2}$, integration capacitors $C_{I1}$, $C_{I2}$, and switches $S_1$, $S_2$, $S_3$, $S_4$, $S_5$, $S_6$, $S_7$ and $S_8$. Operational amplifier 134 can be a telescopic amplifier or a folded-cascode amplifier. Switches $S_1$-$S_4$ are collectively referred to as signal conducting switches, and switches $S_5$-$S_8$ are collectively referred to as summing junction switches.

Figure 1B:
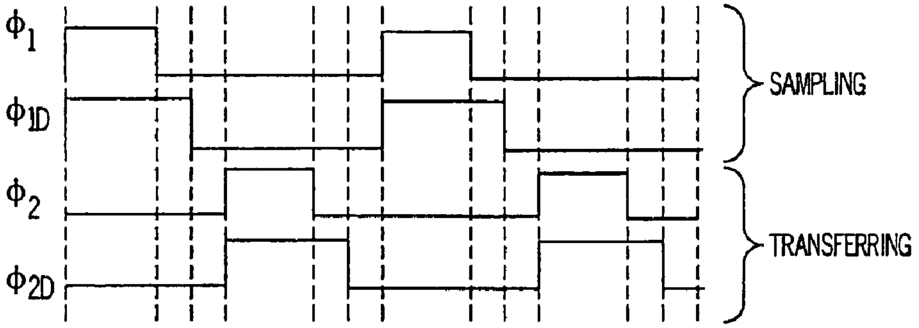
FIG. 1*b* is a two-phase non-overlapping clock scheme.

Referring now to FIG. 1*b*, there is illustrated a two-phase non-overlapping clock scheme defined by four clock waveforms: $\phi_1$, $\phi_{1D}$, $\phi_2$ and $\phi_{2D}$, The position of each of switches $S_1$-$S_8$ from FIG. 1*a* at any given time is determined by its corresponding one of clock waveforms. For the present embodiment, a switch is open when its corresponding clock waveform is in a "low" state, and a switch is close when its corresponding clock waveform is in a "high" state. Clock waveforms $\phi_1$ and $\phi_{1D}$ are in "high" states when $\phi_2$ and $\phi_{2D}$ are in "low" states. Clock waveforms $\phi_{1D}$ and $\phi_{2D}$ are similar to clock waveforms $\phi_1$ and $\phi_2$, respectively. However, the falling edges of clock waveforms $\phi_{1D}$ and $\phi_{2D}$ are not initiated until after clock waveforms $\phi_1$ and $\phi_2$ have returned to their "low" states. Together, clock waveforms $\phi_1$ and $\phi_{1D}$ define a sampling phase of a clock scheme while clock waveforms $\phi_2$ and $\phi_{2D}$ define a transferring phase of the clock scheme.

Figure 2:
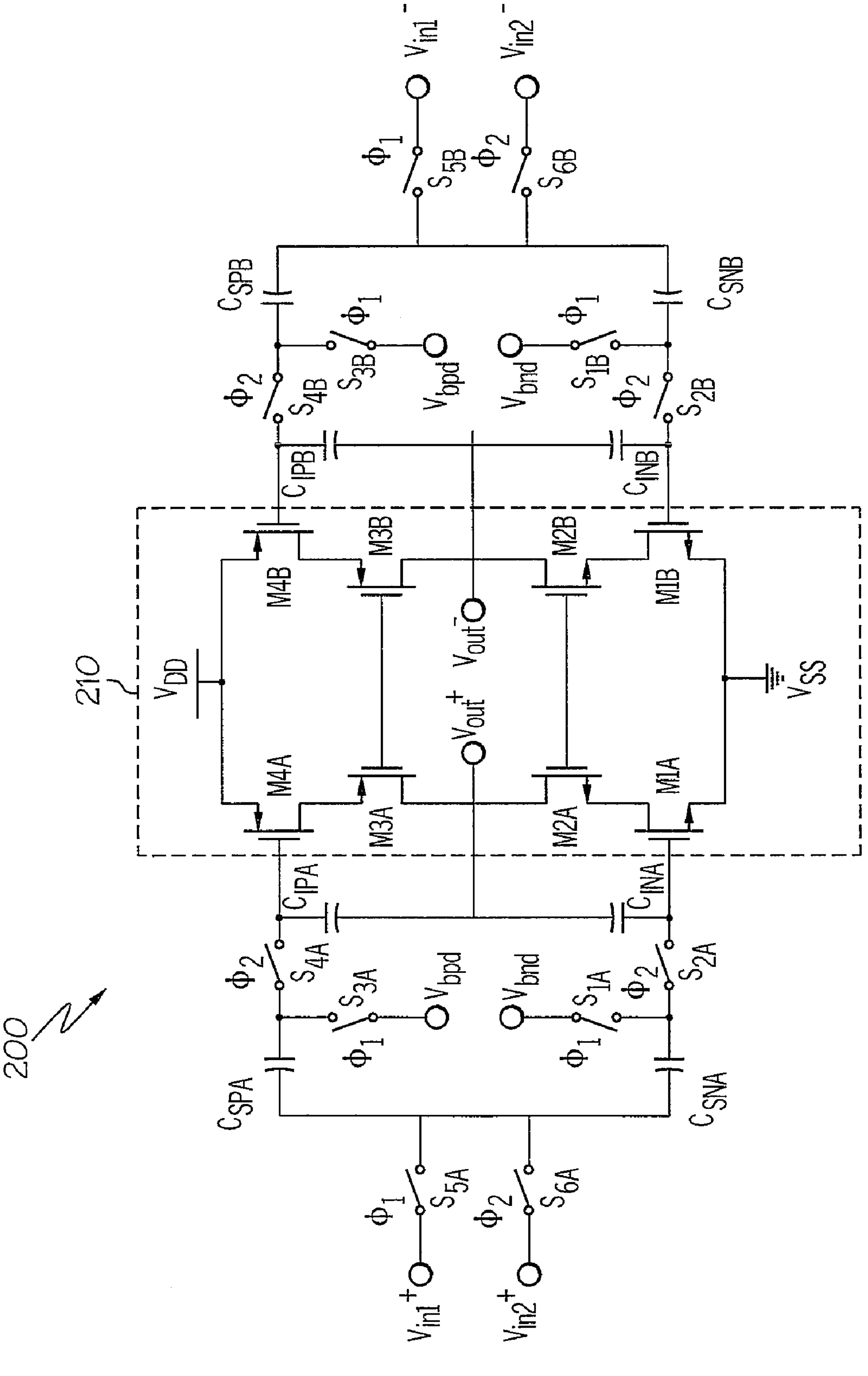
FIG. 2 is a schematic diagram of a switched-capacitor circuit, in accordance with a preferred embodiment of the present invention.

With reference now to FIG. 2, there is depicted a schematic diagram of a switched-capacitor circuit, in accordance with a preferred embodiment of the present invention. As shown, a switched-capacitor circuit 200 includes a split-path pseudo-differential amplifier 210, sampling capacitors $C_{SPA}$, $C_{SNA}$, $C_{SPB}$, $C_{SNB}$, integration capacitors $C_{IPA}$, $C_{INA}$, $C_{IPB}$, $C_{INB}$, and switches S1A, S2A, S3A, S4A, S5A, S6A, S1B, S2B, S3B, S4B, S5B, S6B. Preferably, the capacitance of each of sampling capacitors $C_{SPA}$, $C_{SNA}$, $C_{SPB}$ and $C_{SNB}$ is half the capacitance of $C_{S1}$ or $C_{S2}$ from FIG. 1*a*, and the capacitance of each of integration capacitors $C_{IPA}$. $C_{INA}$, $C_{IPB}$ and $C_{INB}$ is half the capacitance of $C_{I1}$ or $C_{I2}$ from FIG. 1*a*. The position of each of switches S1A-S6A and S1B-S6B at any given time is determined by its corresponding one of the clock waveforms from FIG. 1*b*.

Split-path pseudo-differential amplifier 210 includes p-channel transistors M4A, M3A and n-channel transistors M2A, M1A connected in series between a power supply $V_{DD}$ and a power supply $V_{SS}$. Split-path pseudo-differential amplifier 210 also includes p-channel transistors M4B, M3B and n-channel transistors M2B, M1B connected in series between power supply $V_{DD}$ and power supply $V_{SS}$. The gate of transistor M3A is connected to the gate of transistor M3B, and the gate of transistor M2A is connected to the gate of transistor M2B. Although split-path pseudo-differential amplifier 210 is shown to have p-channel transistors M4A, M3A, M4B, M3B and n-channel transistors M2A, M1A, M2B, M1B, each of transistors M3A, M3B, M2A, M2B is not essential for the operation of the present invention and can be replaced by a shorted wire without affecting the functionality of split-path pseudo-differential amplifier 210.

The gate of input transistor M4A is connected to integration capacitor $C_{IPA}$, and is selectively connected to sampling capacitor $C_{SPA}$ via switch S4A. The gate of input transistor M1A is connected to integration capacitor $C_{INA}$, and is selectively connected to sampling capacitor $C_{SNA}$ via switch S2A. The gate of input transistor M4B is connected to integration capacitor $C_{IPB}$, and is selectively connected to sampling capacitor $C_{SPB}$ via switch S4B. The gate of input transistor M1B is connected to integration capacitor $C_{INB}$, and is selectively connected to sampling capacitor $C_{SNB}$ via switch S2B.

Split-path pseudo-differential amplifier 210 includes four inputs $V_{in1}^+$, $V_{in2}^+$, $V_{in1}^-$, $V_{in2}^-$ and two outputs $V_{out}^+$ and $V_{out}^-$. Input $V_{in1}^+$ is selectively connected to sampling capacitor $C_{SPA}$ via switch S5A. Input $V_{in2}^+$ is selectively connected to sampling capacitor $C_{SNA}$ via switch S6A. Input $V_{in1}^-$ is selectively connected to sampling capacitor $C_{SPB}$ via switch S5B. Input $V_{in1}^-$ is selectively connected to sampling capacitor $C_{SNB}$ via switch S6A. Output $V_{out}^+$ is connected to integration capacitors $C_{IPA}$, $C_{INA}$ and a node located between transistors M3A and M2A. Output $V_{out}^-$ is connected to integration capacitors $C_{IPB}$, $C_{INB}$ and a node located between transistors M3B and M2B.

Bias voltage $V_{bpd}$ is selectively connected to sampling capacitor $C_{SPA}$ via switch S3A, and is selectively connected to sampling capacitor $C_{SPB}$ via switch S3B. Bias voltage $V_{bpd}$ is selectively connected to input transistor M4A via switches S3A, S4A, and is selectively connected to input transistor M4B via switches S3B, S4B. Bias voltage $V_{bnd}$ is selectively connected to sampling capacitor $C_{SNA}$ via switch S1A, and is selectively connected to sampling capacitor $C_{SNB}$ via switch S1B. Bias voltage $V_{bnd}$ is selectively connected to input transistor M1A via switches S1A, S2A, and is selectively connected to input transistor M1B via switches S1B, S2B. Bias voltages $V_{bpd}$ and $V_{bnd}$ are generated by a feedback circuit 300 from FIG. 3 along with its complementary circuit.

Split-path pseudo-differential amplifier 210 reduces power consumption through current reuse. During operation, each of the sampling capacitors (i.e., capacitors $C_{SPA}$, $C_{SNA}$, $C_{SPB}$ and $C_{SNB}$) and integration capacitors (i.e., capacitors $C_{IPA}$, $C_{INA}$, $C_{IPB}$ and $C_{INB}$) are split into two equal parts. One part is connected to the gates of n-channel input transistors (i.e., transistors M1A and M1B) and the other part is connected to the gates of p-channel input transistors (i.e., transistors M4A and M4B). As a result, both input transistors M1A and M4A (or transistors M1B and M4B) contribute signal amplification, while sharing the same drain current.

From an operating principle standpoint, the left half of switched-capacitor circuit 200 can be viewed as an n-channel switched-capacitor integrator (formed by transistors M1A, M2A, capacitors $C_{SNA}$, $C_{INA}$, and switches S1A, S2A) and a p-channel switched-capacitor integrator (formed by transistors M3A, M4A, capacitors $C_{SPA}$, $C_{IPA}$, and switches S3A, S4A) in parallel. Similarly, the right half of switched-capacitor circuit 200 can be viewed as an n-channel switched-capacitor integrator (formed by transistors M1B, M2B, capacitors $C_{SNB}$, $C_{INB}$, and switches S1B, S2B) and a p-channel switched-capacitor integrator (formed by transistors M3B, M4B, capacitors $C_{SPB}$, $C_{IPB}$, and switches S3B, S4B) in parallel. On both halves, each of the n-channel and p-channel switched-capacitor integrators, which together work in a push-pull fashion, only drives half of the capacitances that a conventional operational amplifier (such as operational amplifier 134 from FIG. 1) needs to drive in order to meet specific signal-to-noise ratio (SNR) specifications. Thus, the required transconductance is reduced by half, as well as the width and drain current of input transistors, which effectively reduces the power dissipation and silicon area of split-path pseudo-differential amplifier 210. The gate bias voltages for the p-channel and n-channel input transistors are generated through switched-capacitor bias network.

Bias voltages $V_{bpd}$ and $V_{bnd}$ are dynamically passed to the gates of p-channel transistors M4A, M4B and n-channel transistors M1A, M1B, respectively. Bias voltage $V_{bnd}$ is connected to $V_{bnc}$ in feedback circuit 300 from FIG. 3, and bias voltage $V_{bpd}$ is connected to an equivalent node of a complementary version of feedback circuit 300 from FIG. 3.

Figure 3:
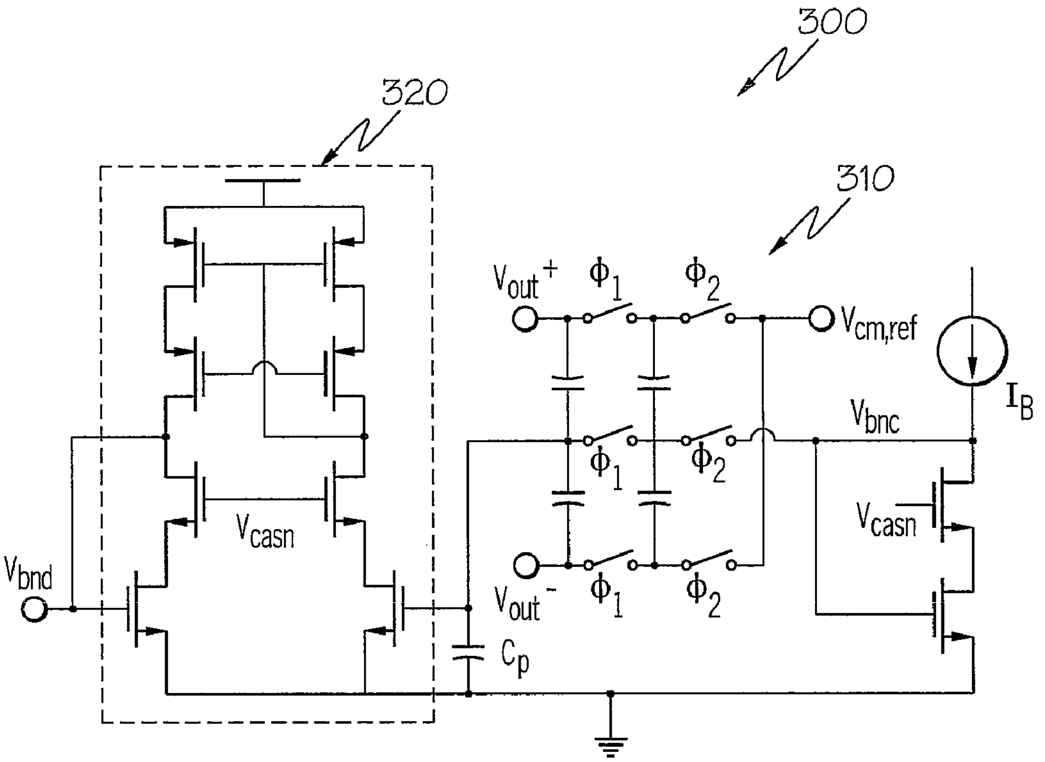
FIG. 3 is a schematic diagram of a common-mode feedback circuit for the switched-capacitor circuit from FIG. 2, in accordance with a preferred embodiment of the present invention.

Referring now to FIG. 3, there is illustrated a schematic diagram of a common-mode feedback circuit for switched-capacitor circuit 200 from FIG. 2, in accordance with a preferred embodiment of the present invention. As shown, feedback circuit 300 is a common-mode feedback circuit having a direct-charge transfer circuit 310 and an amplifier 320.

Figure 4:
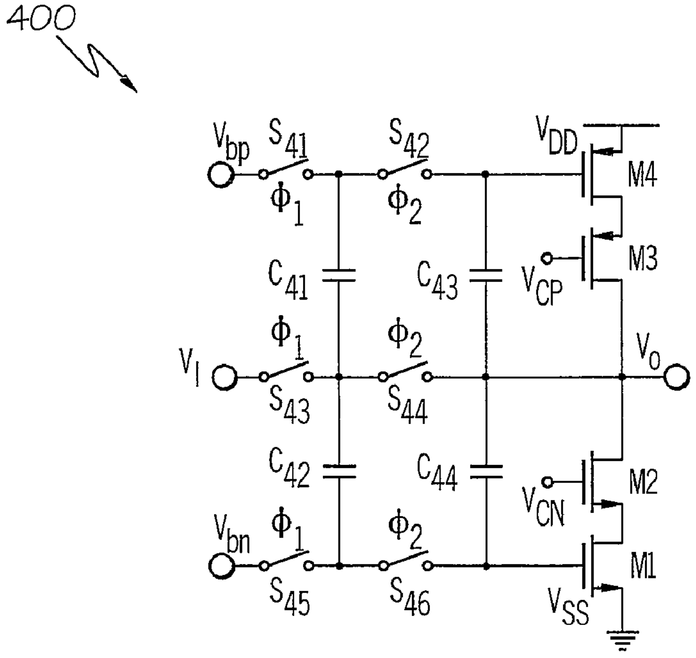
FIG. 4 is a schematic diagram of a voltage reference circuit for the switched-capacitor circuit from FIG. 2, in accordance with a preferred embodiment of the present invention.

With reference now to FIG. 4, there is depicted a schematic diagram of a voltage reference circuit for switched-capacitor circuit 200 from FIG. 2, in accordance with a preferred embodiment of the present invention. As shown, a voltage reference circuit 400 includes p-channel transistors M4, M3 and n-channel transistors M2, M1 connected in series between power supplies $V_{DD}$ and $V_{SS}$. The gate of transistor M3 is connected to voltage $V_{CP}$, and the gate of transistor M2 is connected to voltage $V_{CN}$. Bias voltage $V_{bp}$ is selectively connected to transistor M4 via switches S41 and S42. Bias voltage $V_{bn}$ is selectively connected to transistor M1 via switches S45 and S46. Input $V_I$ is selectively connected to output $V_O$ via switches S43 and S44.

Voltage reference circuit 400 also includes capacitors C41-C44. Capacitor C41 is connected between bias voltage $V_{bp}$ and input $V_I$, and capacitor C42 is connected between input $V_I$ and bias voltage $V_{bn}$. Capacitor C33 is connected between the gate of transistor M4 and output $V_O$, and capacitor C44 is connected between output $V_O$ and the gate of transistor M1. Preferably, the capacitance of each of capacitors C41-C42 is half the capacitance of $C_{S1}$ or $C_{S2}$ from FIG. 1*a*, and the capacitance of each of capacitors C43-C44 is half the capacitance of $C_{I1}$ or $C_{I2}$ from FIG. 1*a*.

As has been described, the present invention provides a switched-capacitor circuit having a split-path pseudo-differential amplifier. For the same transconductance, the input referred noise of the split-path pseudo-differential amplifier of the present invention is smaller than those of conventional telescopic amplifiers and folded-cascode amplifiers. Therefore, comparing to conventional switched-capacitor circuits that employ telescopic and folded-cascode amplifiers, the switched-capacitor circuit of the present invention consumes less power, occupies smaller silicon area, and has lower input referred noise.

While the invention has been particularly shown and described with reference to a preferred embodiment, it will be understood by those skilled in the art that various changes in form and detail may be made therein without departing from the spirit and scope of the invention.

What is claimed is:

1. A switched-capacitor circuit comprising:

a first pair of differential inputs and a second pair of differential inputs;

a p-channel switched-capacitor integrator having a set of p-channel input transistors;

a first pair of sampling capacitors and a first pair of integration capacitors, wherein each of said first pair of sampling capacitors is selectively connected to one of said first pair of differential inputs or one of said p-channel input transistors via a first set of switches;

an n-channel switched-capacitor integrator having a set of n-channel input transistors, wherein said p-channel switched-capacitor integrator and said n-channel switched-capacitor integrator function together in a push-pull fashion such that a required transconductance as well as width and drain current of said n-channel and p-channel input transistors are reduced by half; and a second pair of sampling capacitors and a second pair of integration capacitors, wherein each of said second pair of sampling capacitors is selectively connected to one of said second pair of differential inputs or one of said n-channel input transistors via a second set of switches.

2. The circuit of claim 1, wherein each of said two integration capacitors within said p-channel switched-capacitor integrator is connected between the gate of one of said p-channel input transistors and an output of said switched-capacitor circuit.

3. The circuit of claim 2, wherein each of said two sampling capacitors within said p-channel switched-capacitor integrator is selectively connected to one of said p-channel input transistors within said p-channel switched-capacitor integrator.

4. The circuit of claim 1, wherein each of said two integration capacitors within said n-channel switched-capacitor integrator is connected between the gate of one of said n-channel input transistors and an output of said switched-capacitor circuit.

5. The circuit of claim 4, wherein each of said two sampling capacitors within said n-channel switched-capacitor integrator is selectively connected to one of said n-channel input transistors within said n-channel switched-capacitor integrator.

6. The circuit of claim 1, wherein said switch-capacitor circuit further includes a common-mode feedback circuit having a direct-charge transfer circuit and an amplifier.

7. The circuit of claim 6, wherein said common-mode feedback circuit is connected to outputs of said p-channel and n-channel switched-capacitor integrators.

* * * * *